(12) United States Patent
Birth et al.

(10) Patent No.: US 6,897,601 B2
(45) Date of Patent: May 24, 2005

(54) PIEZOELECTRIC ELEMENT AND AN OSCILLATION TRANSDUCER WITH A PIEZOELECTRIC ELEMENT

(75) Inventors: Michael Birth, Berlin (DE); Petros Badaljan, Dresden (DE); Timofej Lupeiko, Rostov am Don (RU); Svetlana Poljakova, Rostov am Don (RU); Elena Brajceva, Rostov am Don (RU)

(73) Assignee: Holmberg GmbH & Co. Kg, Berlin (DE)

( * ) Notice: Subject to any disclaimer, the term of this patent is extended or adjusted under 35 U.S.C. 154(b) by 140 days.

(21) Appl. No.: 10/206,600

(22) Filed: Jul. 24, 2002

(65) Prior Publication Data

US 2003/0107302 A1 Jun. 12, 2003

(30) Foreign Application Priority Data

Jul. 27, 2001 (DE) .......................................... 101 37 425
Jul. 27, 2001 (DE) .......................................... 101 37 424

(51) Int. Cl.[7] ............................................. H01L 41/08
(52) U.S. Cl. ....................... 310/334; 310/326; 310/340; 310/358
(58) Field of Search ........................ 310/328, 330–332, 310/340, 358, 334, 338

(56) References Cited

U.S. PATENT DOCUMENTS

| 2,814,575 A | * | 11/1957 | Lange, Jr. ....................... 134/1 |
| 3,230,402 A | * | 1/1966 | Nightingale et al. ........ 310/338 |
| 3,360,665 A | * | 12/1967 | Boswell ....................... 310/328 |
| 4,707,311 A | * | 11/1987 | Okazaki ....................... 264/43 |
| 4,928,264 A | * | 5/1990 | Kahn ........................... 367/141 |
| 4,939,405 A | * | 7/1990 | Okuyama et al. ........... 310/330 |
| 4,952,836 A | * | 8/1990 | Robertson .................... 310/339 |
| 5,148,077 A | * | 9/1992 | Grawey et al. ............. 310/328 |
| 5,305,507 A | * | 4/1994 | Dvorsky et al. ........... 29/25.35 |
| 5,550,790 A | * | 8/1996 | Velamoor et al. ........... 367/140 |
| 5,894,651 A | * | 4/1999 | Dvorsky et al. ............. 310/344 |
| 6,111,339 A | * | 8/2000 | Ohya et al. .................. 310/358 |

FOREIGN PATENT DOCUMENTS

| DE | 30 23 155 A1 | 6/1980 |
| DE | 40 29 972 A1 | 3/1992 |
| DE | 198 14 697 C1 | 10/1999 |
| EP | 0 515 521 B1 | 12/1992 |
| JP | 060780700 A | 1/1988 |
| JP | 06269094 A | 9/1994 |

OTHER PUBLICATIONS

IEEE Ultrasonics Symposium 1994 S. 561–564.
IEEE Ultrasonic Symposium an application on Ferroelectric, 1998, ISAF 98, S. 373–376.

* cited by examiner

*Primary Examiner*—Mark Budd
(74) *Attorney, Agent, or Firm*—Marshall & Melhorn, LLC

(57) ABSTRACT

There is put forward a piezoelectric element for converting pressure signals into electrical signals and vice versa, with a porous homogeneous ceramic body and with at least two electrodes attached to the ceramic body. The porous ceramic body comprises open pores and is preferably hermetically sealed on the whole surface with an elastic coating. Furthermore there is suggested an oscillation transducer with the piezolement which is accommodated in a housing. The piezoelectric element is with one end face rigidly connected to the base of the housing. The other end face represents a surface which is sensitive to oscillations, which preferably is not covered by the housing. The volume of the housing is filled with a casting compound, wherein the piezoelectric element is mechanically decoupled from the casting compound.

20 Claims, 3 Drawing Sheets

PIEZOELECTRIC ELEMENT AND AN OSCILLATION TRANSDUCER WITH A PIEZOELECTRIC ELEMENT

BACKGROUND OF THE INVENTION

The invention relates to a piezoelectric element for converting pressure signals into electrical signals and vice versa, according to the preamble of the independent claim as well as to an oscillation transducer with a piezolectric element.

From DE 40 29 972 there is known a piezoelement which is designed as an ultrasound tranducer and which consists of several layers of a porous piezoceramic arranged over one another, with electrodes connected therebetween. Each layer of the porous piezoceramic is manufactured by pulling a plastic foil through a supply vessel which contains a ceramic slip mixed with a pearl polymeride. The foil stack is subsequently pressed and fired. Within each layer the porous piezoceramic with respect to the porosity has a gradient, wherein on the border surfaces there is present a minimal porosity for improving the contact to the electrodes.

Oscillation transducers are used for the most different of applications, they may be used in microphones, in particular contact microphones for the purpose of news transmission, in acceleration recorders, apparatus for auscultative diagnosis, seismic ground examination or likewise, in safety signal systems and other installations.

From EP 0 515 521 B1 there is known a piezoceramic acceleration recorder which comprises a box-like two-part housing of glass or ceramic in which there is formed a hollow space, wherein between the two parts of the housing there is fastened a piezoceramic plate which engages into the hollow space. The piezoceramic plate is provided with electrodes in the edge corner region which serves for fastening between the housing halves, wherein the housing halves have metallisations for connecting the electrodes with contact connection locations to an electrical circuit.

OBJECT OF THE INVENTION

It is the object of the invention to provide a piezolectric element for converting pressure signals into electrical signals and vice versa with which the sensitivity is increased and simultaneously a sufficient mechanical stability is made available, wherein with regard to the oscillation transducer the increased sensitivity is designed in particular in one direction.

According to the invention this object is achieved by the feature of the independent claim and the dependent claims.

By way of the measures specified in the dependent claims advantageous further developments and improvements are possible.

A SUMMARY OF THE INVENTION

Porous piezoceramic is to be understood as piezoceramic material, e.g. based on a soldified lead titanium zirconate mixture, having piezoelectric properties and having pores. Depending on whether the ceramic body encloses closed, i.e. isolated, or open, i.e. communicating pores, the porous piezoceramic belongs to the piezocomposites which correspond to a bond 3-0 or 3-3.

It has been shown that with the transition from highly rigid, low-pore ceramics to highly porous piezoceramics the piezoelectric voltage constant $g_H$ (air sound sensitivity/thickness piezoceramic) which is a measure of the sensitivity, is significantly increased, wherein in particular with a porosity of more than 30% by volume there occurs a non-linear increase of the elastic deformability of the ceramic and a reduction in the Poisson number, i.e. the transversal contraction coefficient, corresponding to the increase in the ceramic porosity. The first property ensures a high sensitivity and the second has the effect that with a mechanical oscillation having a spacial effect on all sides, the size of the piezoelectric constants $g_H$, i.e. the sensitivity remains in its full extent in the polarisation axis, whilst with solid ceramics it reduces on account of the superposition of the signal components of the main axis, i.e. the polarisation axis with counter-phased signal components of the secondary axes, thus becomes less sensitive.

This effect is shown most clearly with the porous ceramic with open pores, wherein however with the increase of the porosity of the ceramic body, its mechanical strength is reduced, so that highly porous ceramic is not usually used. It is known for improving the mechanical stability of the highly porous piezoceramic with open pores to use various polymer composites for filling the pores, although at the same time the volumetric piezosensitivity is considerably reduced. Typical fillers are epoxy resin and silicone rubber.

By way of the fact that according to the invention the porous ceramic body comprises open pores and is provided with an elastic coating at least on the surface which is not taken up by electrodes, the piezoelectric voltage constant of the piezoelectric element is considerably increased, wherein the elastic coating improves the mechanical strength of the ceramic body. At the same time it is particularly advantageous when the ceramic body on its whole surface is hermetically covered with the coating.

The role of the elastic coating, apart from increasing the mechanical strength of the ceramic body with a higher porosity by which means its use in a piezoelectric element for converting pressure signals into electrical signals and vice versa is possible, lies in the fact that thanks to this coating with the an effect for example of an acoustic wave there arises a pressure drop between the inner volume of the piezoelement and the surrounding medium, and a correspondingly increased deformability of the piezoelement is effected. On account of the low Poisson number of the highly porous piezoceramic, the increased volumetric deformation is transformed into a single-axis, mainly longitudinal deformation which as a result of a direct piezoeffect activates an electrical charging at the electrodes of the piezoelement. In the end result the volumetric exit signal is transformed by the piezoelement of porous ceramic into an adequately high electrical signal. With the abscence of the elastic coating the deformation of the piezoelement is considerably smaller since there arises no pressure gradient and thus its piezoelectric voltage constant is likewise lower.

In an advantageous manner the porous ceramic body over the whole sectional area is essentially homogeneous as to the distribution of the open pores communicating with each other. In order not to destroy the "breathing" by way of which the pressure gradient within the ceramic body is increased, due extraneous material, the pores are filled with air or gas only and not with solid filling material and a sandwich structure with different material is prevented.

Also the thickness of the elastic coating which has an elasticity in the region between 10 and 50 Shore A, preferably may lie between 10 and 30 Shore A, is to be selected depending on the material such that the deformation is not inhibited. This thickness lies in the range of 0.1 to 1.5 mm, preferably it is about 0.1 to 0.5 mm.

The porosity is advantageously to be selected as high as possible, the upper limit is limited by the required strength, the desired sensitivity and the method of manufacture.

By way of the fact that the oscillation transducer according to the invention comprises a piezoelement with the porous ceramic body with open pores, which with one end face is essentially rigidly fastened to the base of a housing and the opposite end face of the piezoelement represents the sensitive surface and the volume of the housing at least is partly filled with a casting compound, wherein the piezo-element is mechanically decoupled fom the casting compound, one achieves a high sensitivity of the oscillation transducer to oscillation signals with a good signal-to-noise ratio and by way of the mechanical decoupling its amplitude-frequency response is improved, wherein on account of the rigid connection of the porous ceramic body to the base of the housing and on account of the surrounding casting compound the sensitivity is directed.

It is further advantageous that the housing is set on a frame of oscillation-absorbing material and is connected to this, i.e. is elastically and oscillation-dampingly mounted, since with this the sensitivity of the transducer to extraneous oscillations is greatly decreased whilst maintaining the high sensitivity with respect to the oscillations which impinge on the front side, wherein this effect is improved even more if the frame consists of a sleeve surrounding the housing and a base plate, wherein between the sleeve and the housing, and the base plate and the housing there is provided an intermediate space which is filled with an oscillation-damping or oscillation-absorbing medium.

Embodiment examples of the invention are shown in the drawings and are explained in more detail in the subsequent description. There are shown in:

DETAILED DESCRIPTION OF THE PREFERRED EMBODIMENT

Figure 1:
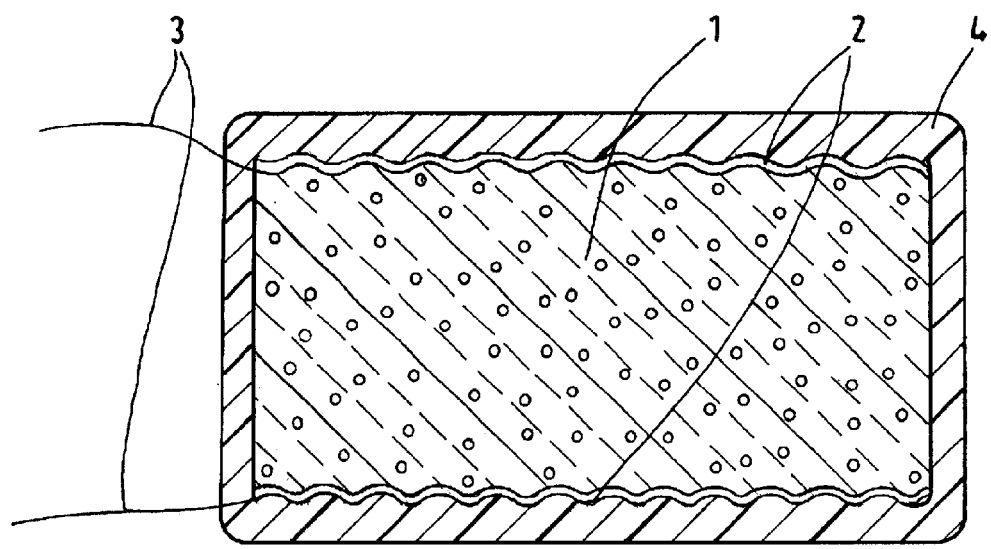
FIG. 1 a section through the piezoelectric element according to one embodiment example of the present invention.

In FIG. 1 a porous, essentially homogeneous ceramic body is indicated at 1, which comprises open pores, wherein the volume taken up by the pores is not smaller than 10%, preferably larger than 30%, for example the porosity lies between 50 and 70%. The pores are usually filled with air, but may also contain another gases. On two opposite surfaces of the ceramic body 1 there are attached two electrodes 2 which are connected to connection wires 3. The ceramic body 1 is provided over its whole periphery, where appropriate disregarding the surface taken up by the electrodes 2, with a hermetically tight elastic coating 4, for example a polymer such as polyurethane, silicone rubber, isoprene rubber or likewise. The elastic coating may only be so thick that the deformability of the ceramic body remains on account of the oscillations, i.e. the deformation is not prevented, wherein this to the same extent applies to the elasticity of the coating. The elasticity should for example lie in a region of 10 to 50 Shore A, preferably a range of 10 to 30 Shore A. The layer thickness of the elastic coating may lie in a range between 0.1 to 1.5 mm, preferably between 0.1 to 1.0 mm depending on the used material. Particularly good results are achieved between 0.1 and 0.5 mm.

EXAMPLES

As concrete exemplary embodiments piezoelements were manufactured of piezoceramic material PTZ-36 with a porosity of 62–63% by volume in the form of disks with a diameter of 12 mm and a height of 5 mm. After depositing a metal layer onto the end faces of the disks, soldering-on wire for taking the signals at these layers and polarisation of the ceramic body for the purpose of comparison, these surfaces of the elements were sealed with a layer of different elastic polymers such as polyurethane, silicone rubber and synthetic rubber.

The piezolectric voltage constant $g_H$ were determined according to the formula $$g_H = \gamma/h$$

wherein $\gamma$ is the air sound sensitivity of the ceramic body in mV/Pa and h the height of the ceramic body, measured in a reflection-poor space at a frequency of 1000 Hz. The results achieved are specified in Table 1.

TABLE 1

| Pos. No. | coating material with the parameter layer thickness h = 0.5 mm | $g_H$ [mV · m/N] |
|---|---|---|
| 1 | epoxy resin | 28 |
| 2 | polymethyl methacrylate | 28 |
| 3 | polyurethane | 252 |
| 4 | silicone rubber | 280 |
| 5 | synthetic isoprene rubber | 294 |
| 6 | without coating | 14 |

From the specified data it results that by way of using elastic coatings one maintains a high piezoelectric voltage constant of the elements of open porous ceramic, wherein the sensitivity of the same ceramic body without coating is exceeded by a factor of 20. It is likewise deduced from Table 1 that an inelastic coating leads to an increase of the piezolelectric voltage constants only by a factor of 2.

The positive influence of an elastic coating on the piezosensitivity occurs in a wide frequency bandwidth, wherein in Table 2 there are specified the piezolectric voltage constants $g_H$(mV·m/N) in dependence on the frequency, for an elastic and an inelastic coating.

TABLE 2

| frequency (in Hz) | 10 | 100 | 1000 | 5000 | 10000 | 15000 |
|---|---|---|---|---|---|---|
| $g_H$ with elastic coating | 230 | 250 | 280 | 230 | 250 | 265 |
| $g_H$ with inelastic coating | 10 | 14 | 28 | 28 | 28 | 28 |

In contrast to the nature of the porosity (open or closed pores) the size of the pores only slightly influences the piezoesensitivity. Table 3 shows the sensitivity values of piezoelements with the same open porosity in dependence on the pore size, with a coating with silicone rubber.

TABLE 3

| pore size (in μm) | $g_H$ [mV · m/N] |
|---|---|
| 20–80 | 280 |
| 50–200 | 308 |
| 100–500 | 300 |
| 500–1000 | 280 |

In a further example according to Table 4 the piezosensitivity is represented in dependence on the coating thickness of the coating material without additional mass impingement, with a porosity of 56%.

TABLE 4

| layer thickness [mm] | 0.0 | 0.1 | 0.5 | 1.0 | 1.5 | 2.0 | 2.5 |
|---|---|---|---|---|---|---|---|
| airborne sound sensitivity [mV/Pa] | 0.02 | 0.7 | 0.7 | 0.7 | 0.45 | 0.33 | 0.21 |
| solid-borne sound sensitivity [mV/g] | 1.2 | 25 | 27 | 20 | 15 | 11 | 7 |

It is to be recognised that with a layer thickness of 0.1 and 0.5 mm one may achieve the largest sensitivities.

With the piezoelectric element one achieves a very much higher piezo-sensitivity than is achieved in the state of the art, and it has a more simple design. In comparison to piezolements of solid piezoceramic the piezolement according to the invention has a piezoelectric voltage constant which is almost two size orders higher and is characterised by a broad frequency spectrum (10 Hz to 200 Hz) and a uniform amplitude frequency response with which the fluctuations in the audio frequency bandwidth do not exceed 6 dB.

Figure 2:
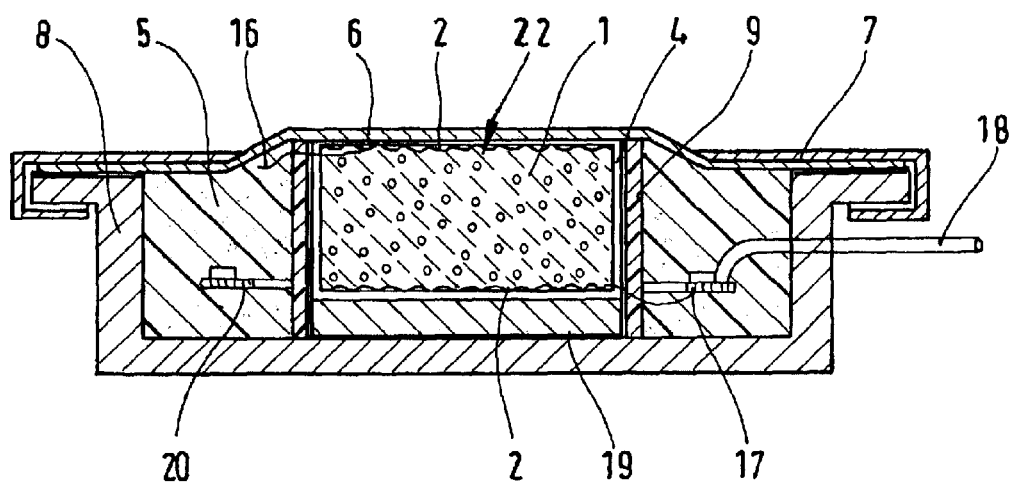
FIG. 2 a section through an oscillation transducer according to a first embodiment example, and FIG. 3 a section through a further embodiment example of the oscillation transducer according to the invention.

In FIG. 2 there is shown an oscillation transducer which uses the above described piezoelement. The oscillation transducer comprises a piezoelectric element 22 accommodated in a housing 22, wherein the piezolectric element 22 is surrounded by a casting compound 5 filling up the housing 8. The housing 8 is formed e.g. pot-shaped and is open at one side, in FIG. 2 open at the top, wherein the piezoelectric element 22 projects somewhat beyond the level of the casting compound 5 and represents the sensitive sensor surface of the piezoelement 22. The housing 8, i.e. the piezoelement 22 and the casting compound 5 are covered with a shielding foil 6, consisting of a metal foil or a fine wire fabric or metallised plastic foil or electrically conducting polymer. The housing comprises a flange-like edge which is surrounded by a flanged ring 7, wherein the ring 7 engages over the shielding foil 6 and the edge of the housing 8.

The piezoelement 22 is provided with the electrodes for transmitting further the electrical signals. The electrodes 2 are connected to an impedance converter circuit 20 by way of which the corresponding electrical adaptation is realised. The upper electrode 2 is connected to the shielding foil 6 via a connection 16, whilst the lower electrode 2 is connected to the impedance converter circuit 20 via the lead 10. A connection cable 18 leads to the outside.

The porous ceramic body 1 for a mechanical stabilisation and for increasing the pressure gradient is provided with an elastic coating 4 which hermetically surrounds the ceramic body 1 on its whole surface.

On manufacture of the oscillation transducer according to FIG. 2, the porous ceramic body 1 provided with an elastic polymer coating 4, with one end face via a rigid connection 19 is connected e.g. to an adhesive layer on the base of the housing. The ceramic body 1 provided with the elastic coating 4 is connected to a loose cover 9, i.e. not rigidly connected to it, which for example is formed as a silicone tubing which is pushed over the ceramic body 1, and subsequently the housing is completely or partly filled with a casting compound, with an epoxy resin or with another weakly elastic compound. With this the cover 9 separates the piezoelement 22 from the casting compound 5 and forms the mechanical decoupling. The impedance converter circuit connected to the electrodes is co-cast and is surrounded by the casting compound 5.

As a result of such an arrangement according to FIG. 2 it is achieved that the rear side of the ceramic body is maximally "loaded" with the inert mass of the housing 8 and its front side is maximally "relieved", which increases the sensitivity of the oscillation transducer on it front side and simultaneously reduces its sensitivity on the rear side. The use of the protective cover 9 for the cover surface or the side surface of the piezoelement furthermore permits the use of a weakly elastic element for casting the housing without compromising the transducer sensitivity, which makes it possible to shift the self-resonance of the transducer into the high frequency region and thus to improve its amplitude frequency response in the low frequency region.

Such a transducer may, as already mentioned, be used as a contact or impact noise microphone, wherein then only the end face of the piezoelement which projects beyond the front side of the housing 8 has contact with the surface of a signal source.

One example of a transducer shown in FIG. 2 has a height of 5.8 mm and a diameter of 21.5/18.0 mm and a weight of about 7 g, wherein the impact noise transmission coefficient is 1500 mV/g and the amplitude frequency response in the frequency range of 50–5000 Hz runs within a 6 dB tolerance and the ratio of the sensitivity of its front and rear side has a value of around 20 dB.

Figure 3:
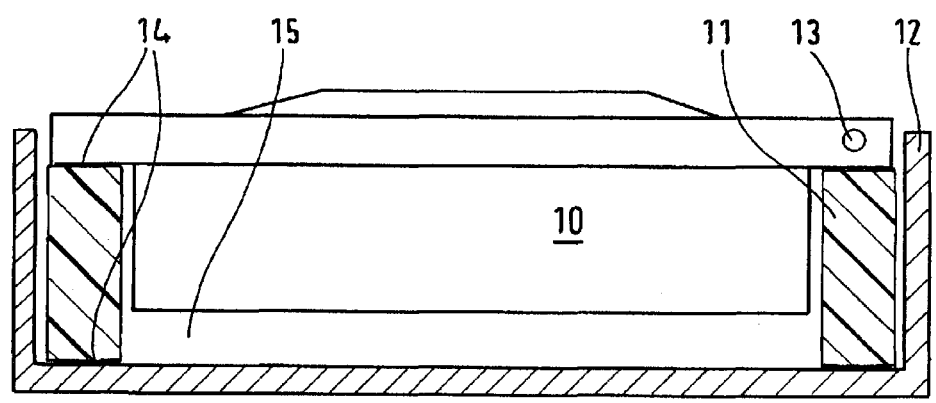

A further embodiment example is shown in FIG. 3, wherein the transducer is indicated at 10 and may have the construction according to FIG. 2.

As is to be recognised, the housing 9 over its edge 13 is supported by a cylindrical sleeve 11 of elastic sound-absorbing material which surrounds the housing 8 on its circumference. Furthermore there is provided an again pot-shaped cover cap 12 into which the housing 8 with the cylinder 11 is placed, wherein the cylinder 11 of sound-absorbing material via connection locations 14 on the one hand is connected to the flange-like edge 13 and on the other hand to the base of the cover cap 12. At the same time between the base of the housing 1 and the base of the cartridge 12 there is provided an intermediate space 15 which is filled with an oscillation absorbing medium. This may be air, a vacuum, fluid or other.

In the present embodiment example a cover cap is used, other designs may also be provided in order to render the oscillation transducer 10 insensitive to extraneous oscillations, wherein however the basic concept of the elastic sound-absorbing suspension of the transducer and of the intermediate space remains in the manner of a double base.

On account of the arrangement one achieves a great reduction or for certain frequencies a practically complete suppression of the sensitivity of the transducer to extraneous oscillation whilst maintaining the high sensitivity to oscillation signals which impinge it from the front side, with a minimal increase in the transducer thickness. The sleeve of elastic sound-absorbing material surrounding the housing of the transducer, which may be formed as a cylinder, is fastened with one side to the front side of the housing and with the other side to the base of the cover cap pushed onto the transducer, or also only to one outer disk. At the same time between the housing of the transducer and the disk or between the housing and the base of the cover cap there is formed an intermediate space in the manner of a double base which may either be filled with a gas, a vacuum, a fluid or another oscillation-absorbing medium.

What is claimed is:

1. An oscillation transducer comprising a piezoelectric element for converting pressure signals into electrical signals and vice versa, with a porous ceramic body and with at least two electrodes attached onto the ceramic body, wherein the porous ceramic body comprises open pores and at least on the surface which is not taken up by the electrodes is provided with an elastic coating for increasing the pressure gradient within the ceramic body;

said piezoelectric element being accommodated in a housing, wherein one end face of the piezoelectric element is rigidly connected to the housing base and the opposite end face represents a surface which is sensitive to the oscillations from the outer space, and the piezoelectric element in the housing is surrounded by a casting compound and is mechanically decoupled from this.

2. An oscillation transducer according to claim 1, wherein the lateral circumferential surface of the piezoelectric element comprises a cover which is loosely connected to this, as a mechanic decoupling, which separates the casting compound from the piezoelectric element.

3. An oscillation transducer according to claim 1, wherein the electrodes of the piezoelectric element are connected to an impedance converter circuit, which is cast into the casting compound.

4. An oscillation transducer according to claim 1, wherein the sensitive end surface of the piezoelectric element projects beyond the housing.

5. An oscillation transducer according to claim 1, wherein the sensitive end face is covered over by a metal foil or a wire fabric or a metallized plastic foil or an electrically conducting elastomer.

6. An oscillation transducer according to claim 1, wherein the housing is placed onto a frame of oscillation-absorbing material and is connected to this.

7. An oscillation transducer according to claim 6, wherein the frame comprises a sleeve at least partly surrounding the housing, and a base plate, wherein between the sleeve and the housing there is provided an intermediate space which is filled with an oscillation-damping medium.

8. An oscillation transducer according to claim 7, wherein the sleeve is fastened on a flange of the housing and a base plate is a constituent part of a cover cap surrounding the housing.

9. An oscillation transducer according to claim 1, wherein the elastic coating is formed hermetically sealing and covers the whole surface of the ceramic body with electrodes.

10. An oscillation transducer according to claim 1, wherein the porous ceramic body is manufactured of a lead titanate zirconate mixture.

11. An oscillation transducer according to claim 1, wherein the porosity is at least 10%.

12. An oscillation transducer according to claim 11, wherein the porosity lies between 50 and 70%.

13. An oscillation transducer according to claim 1, wherein the coating consists essentially of silicone rubber, isoprene rubber or polyurethane or likewise.

14. An oscillation transducer according to claim 1, wherein the thickness of the coating lies in the region of 0.1 to 1.5 mm.

15. An oscillation transducer according to claim 1, wherein the elasticity of the coating lies in the range of 10 to 50 Shore A.

16. An oscillation transducer according to claim 1, wherein the porous ceramic body with open pores is essentially homogeneous.

17. An oscillation transducer according to claim 11, wherein the porosity is more than 30%.

18. An oscillation transducer according to claim 14, wherein the thickness of the coating lies in the region of 0.1 to 1.0 mm.

19. An oscillation transducer according to claim 18, wherein the thickness of the coating lies in the region of 0.1 to 0.5 mm.

20. An oscillation transducer according to claim 15, wherein the elasticity of the coating lies in the range of 10 to 30 Shore A.

* * * * *